United States Patent
Kambara

(10) Patent No.: US 7,065,002 B2
(45) Date of Patent: Jun. 20, 2006

(54) MEMORY DEVICE, MEMORY DEVICE READ METHOD

(75) Inventor: Fumi Kambara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/999,067

(22) Filed: Nov. 30, 2004

(65) Prior Publication Data

US 2006/0034135 A1    Feb. 16, 2006

(30) Foreign Application Priority Data

Aug. 11, 2004  (JP)  .............................. 2004-233973

(51) Int. Cl.
    *G11C 8/00*  (2006.01)

(52) U.S. Cl. .................. 365/233; 365/194; 365/189.05

(58) Field of Classification Search ................ 365/194, 365/206, 233, 189.05
    See application file for complete search history.

(56) References Cited

U.S. PATENT DOCUMENTS

| 5,710,736 A | * | 1/1998 | Masuda et al. ........ 365/189.07 |
| 5,812,492 A | | 9/1998 | Yamauchi et al. |
| 6,192,003 B1 | | 2/2001 | Ohta et al. |
| 6,236,253 B1 | * | 5/2001 | Leasure et al. ............. 327/198 |

FOREIGN PATENT DOCUMENTS

| JP | 9-320261 | 12/1997 |
| JP | 2000-163966 | 6/2000 |

* cited by examiner

*Primary Examiner*—Son T. Dinh
(74) *Attorney, Agent, or Firm*—Staas & Halsey LLP

(57) ABSTRACT

A memory device that amplifiers read data based on the timing of a CLK signal input from an external device comprises: a delay circuit 5 that controls a code of the CLK signal and a delay amount based on a CT signal input from an external device to output a CLK_delay signal; a sense enable signal generation section 6 that generates a sense enable signal based on the CLK_delay signal; a memory cell 4 that outputs data in accordance with an instruction from outside; and a sense amplifier 7 that amplifiers the output of the memory cell in accordance with the sense enable signal.

11 Claims, 5 Drawing Sheets

| CT[3] | CT[2] | CT[1] | CT[0] | CT value (Decimal) | Delay amount (second) |
|---|---|---|---|---|---|
| 0 | 0 | 0 | 0 | CT0 | -20p |
| 0 | 0 | 0 | 1 | CT1 | 0 |
| 0 | 0 | 1 | 0 | CT2 | 20p |
| 0 | 0 | 1 | 1 | CT3 | 40p |
| 0 | 1 | 0 | 0 | CT4 | 60p |
| 0 | 1 | 0 | 1 | CT5 | 80p |
| 0 | 1 | 1 | 0 | CT6 | 100p |
| 0 | 1 | 1 | 1 | CT7 | 120p |
| 1 | 0 | 0 | 0 | CT8 | 1/2 cycle -20p |
| 1 | 0 | 0 | 1 | CT9 | 1/2 cycle +0p |
| 1 | 0 | 1 | 0 | CT10 | 1/2 cycle +20p |
| 1 | 0 | 1 | 1 | CT11 | 1/2 cycle +40p |
| 1 | 0 | 0 | 0 | CT12 | 1/2 cycle +60p |
| 1 | 1 | 0 | 1 | CT13 | 1/2 cycle +80p |
| 1 | 1 | 1 | 0 | CT14 | 1/2 cycle +100p |
| 1 | 1 | 1 | 1 | CT15 | 1/2 cycle +120p |

| CT[3] | CT[2] | CT[1] | CT value (Decimal) | Delay amount (second) |
|---|---|---|---|---|
| 0 | 0 | 0 | CT0 | -20p |
| 0 | 0 | 1 | CT1 | 0 |
| 0 | 1 | 0 | CT2 | 20p |
| 0 | 1 | 1 | CT3 | 40p |
| 1 | 0 | 0 | CT4 | 60p |
| 1 | 0 | 1 | CT5 | 80p |
| 1 | 1 | 0 | CT6 | 100p |
| 1 | 1 | 1 | CT7 | 1/2 cycle |

PRIOR ART

FIG. 7

| CT[2] | CT[1] | CT[0] | CT value (Decimal) | Delay amount (second) |
|---|---|---|---|---|
| 0 | 0 | 0 | CT0 | -20p |
| 0 | 0 | 1 | CT1 | 0 |
| 0 | 1 | 0 | CT2 | 20p |
| 0 | 1 | 1 | CT3 | 40p |
| 1 | 0 | 0 | CT4 | 60p |
| 1 | 0 | 1 | CT5 | 80p |
| 1 | 1 | 0 | CT6 | 100p |
| 1 | 1 | 1 | CT7 | 120p |

PRIOR ART

MEMORY DEVICE, MEMORY DEVICE READ METHOD

BACKGROUND OF THE INVENTION

1. Field of the Invention

The present invention relates to a memory device and a memory device read method that cope with variation in timing of a read operation.

2. Description of the Related Art

Firstly, a conventional memory device will be described. Here, a RAM is taken as an example of the memory device. FIG. 5 is a block diagram showing a configuration example of a conventional RAM (Random Access Memory). The RAM includes latches 1, 2, and 3, a memory cell 4, a delay circuit 15, a sense enable signal generation section 6, and a sense amplifier 7.

The latch 1 latches an address signal input from an external device and outputs it to the memory cell 4 and sense enable signal generation section 6. The latch 2 latches a written enable signal input from an external device and outputs it to the memory cell 4 and sense enable signal generation section 6. The latch 3 latches a write data signal input from an external device and outputs it to the memory cell 4. The delay circuit 15 delays a CLK (clock) signal according to a value represented by a CT (clock tune) signal input from an external device and outputs the CLK signal to the sense enable signal generation section 6 as a CLK_delay signal. The sense enable signal generation section 6 generates a sense enable signal using outputs of the latches 1 and 2 and CLK_delay signal and outputs it to the sense amplifier 7. The timing of the sense enable signal is synchronous with the rise edge of the CLK_delay signal.

A description will next be given of a read operation. FIGS. 6A and 6B are timing charts of a read operation in the conventional RAM. FIG. 6A is a timing chart of a read operation with a high frequency CLK signal; and FIG. 6B is a timing chart of a read operation with a low frequency CLK signal. The memory cell 4 outputs a result obtained by reading out the data designated by the address signal to the sense amplifier 7 as a bit signal and bit_b signal. The sense amplifier 7 amplifies the difference of the bit signal and bit_b signal while the sense enable signal is ON and outputs the obtained signal to an external device as a read data signal. As shown in FIG. 6A, the delay circuit 15 provides a delay amount Ta to the CLK signal to generate a CLK_delay signal in order to align the timing with the bit signal and bit_b signal, and a sense enable signal is generated in synchronization with the rise edge of the CLK_delay signal.

Therefore, in RAM design, it is important for the sense amplifier 7 to amplify the potential change of the bit signal and bit_b signal read out from the memory cell 4 at high speed. That is, how the timing at which the sense enable signal is ON is allowed to coincide with the timing of the potential change of the bit signal and bit_b signal is important.

FIG. 7 is a table showing a setting example of the delay amount in the conventional delay circuit. In this example, a 3-bit CT signal consisting of CT[0], CT[1] and CT[2] is input to the delay circuit 15. The delay circuit 15 switches the number of internal delay elements in accordance with the numerical value represented by the CT signal to control the delay of the sense enable signal with respect to the rise edge of the CLK signal within a range of −20 ps to +120 ps.

While the time required from the activation of a word line of the RAM to the change in bit line potential varies depending on a process, it is possible to cope with variation in the process to some degree by controlling the timing of the sense enable signal using the CT from an external device.

As the conventional art related to the present invention, for example, Jpn. Pat. Appln. Laid-open Publication No. 2000-163966 (pages 3 to 8, FIG. 1) is known.

However, in the case where processes differ greatly or the RAM that has been operated with high frequency is operated with low frequency, the timing of sense enable signal greatly differs from that of the change in bit line potential. As shown in FIG. 6B, in the case where the RAM is operated with a low frequency CLK signal, the time required from the rise edge of the CLK signal to the timing of bit signal and bit_b signal becomes longer than in the case of FIG. 6A. In this case, the required time exceeds the delay amount Tb that the delay circuit 15 can provide to the CLK signal, with the result that the timing of sense enable signal cannot coincide with that of bit signal and bit_b signal.

SUMMARY OF THE INVENTION

The present invention has been made to solve the above problem and an object thereof is to provide a memory device and a memory device read method that can cope with large variation in timing by controlling a code of the CLK signal for generating the sense enable signal.

To solve the above problem, according to an aspect of the present invention, there is provided a memory device that amplifiers read data based on the timing of a first clock signal input from an external device, comprising: a delay circuit that controls a code of the first clock signal and a delay amount based on a clock tune signal input from an external device to output a second clock signal; a sense enable signal generation section that generates a sense enable signal based on the second clock signal; a memory cell that outputs data in accordance with an instruction from outside; and a sense amplifier that amplifiers the output from the memory cell in accordance with the sense enable signal.

In the memory device according to the present invention, the clock tune signal includes a plurality of bits, and the delay circuit applies an exclusive OR operation to one bit signal of the clock tune signal and the first clock signal to control the code.

In the memory device according to the present invention, the delay circuit controls the delay amount based on the numerical value represented by the signal other than the one bit of the clock tune signal.

In the memory device according to the present invention, the clock tune signal includes a plurality of bits, and the delay circuit applies an exclusive OR operation to the result of an AND operation among all bits of the clock tune signal and the first clock signal to control the code.

In the memory device according to the present invention, the delay circuit controls the delay amount based on the numerical value represented by the clock tune signal.

According to a second aspect of the present invention, there is provided a memory device read method of amplifying read data based on the timing of a first clock signal input from an external device, comprising: a delay step of controlling a code of the first clock signal and a delay amount based on a clock tune signal input from an external device to output a second clock signal; a sense enable signal generation step of generating a sense enable signal based on the second clock signal; a readout memory step of outputting data in accordance with an instruction from outside; and an amplification step of amplifying the output from the memory step in accordance with the sense enable signal.

In the memory device read method according to the present invention, the clock tune signal includes a plurality of bits, and the delay step applies an exclusive OR operation to one bit signal of the clock tune signal and the first clock signal to control the code.

In the memory device read method according to the present invention, the delay step further controls the delay amount based on the numerical value represented by the signal other than the one bit of the clock tune signal.

In the memory device read method according to the present invention, the clock tune signal includes a plurality of bits, and the delay step applies an exclusive OR operation to the result of an AND operation among all bits of the clock tune signal and the first clock signal to control the code.

In the memory device read method according to the present invention, the delay step controls the delay amount based on the numerical value represented by the clock tune signal.

According to the present invention, the delay circuit selects the rise edge or fall edge of the CLK signal as a reference of delay amount, so that it is possible to significantly enlarge a range of delay amount under the same condition as to the scale of a delay device. Therefore, even in the case where processes differ greatly or the RAM that has been operated with high frequency is operated with low frequency, it is possible to cope with variation in timing of the sense enable signal without significantly increasing circuit scale.

BRIEF DESCRIPTION OF THE DRAWINGS

FIG. 7 is a table showing a setting example of a delay amount in a conventional delay circuit.

DETAILED DESCRIPTION OF THE PREFERRED EMBODIMENTS

An embodiment of the present invention will be described below with reference to the accompanying drawings.

Figure 1:
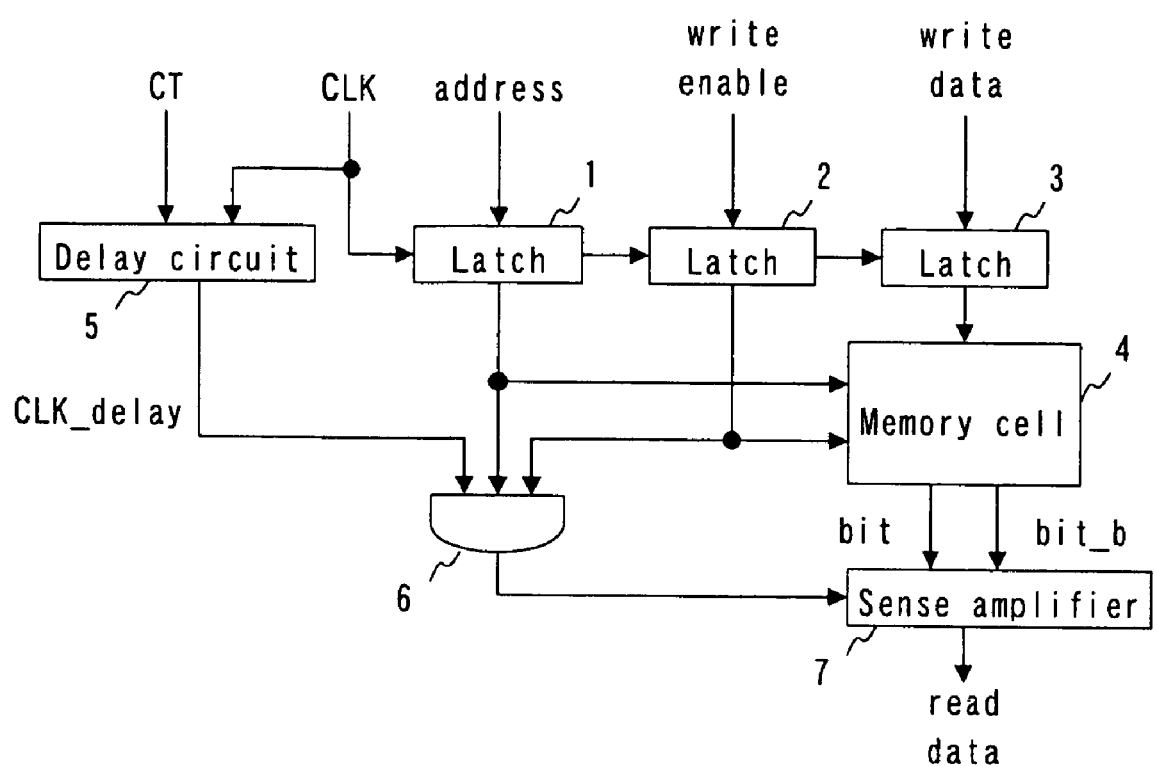
FIG. 1 is a block diagram showing a configuration example of a RAM according to an embodiment of the present invention.

Firstly, a description will be given of a configuration of a memory device according to the embodiment of the present invention. Here, a RAM is taken as an example of the memory device. FIG. 1 is a block diagram showing a configuration example of the RAM according to the embodiment of the present invention. In FIG. 1, the same reference numerals as those in FIG. 5 denote the same or corresponding parts as those in FIG. 5, and the descriptions thereof will be omitted here. The RAM of FIG. 1 includes a delay circuit 5 in place of the delay circuit 15 of FIG. 5.

Figures 2, 3:
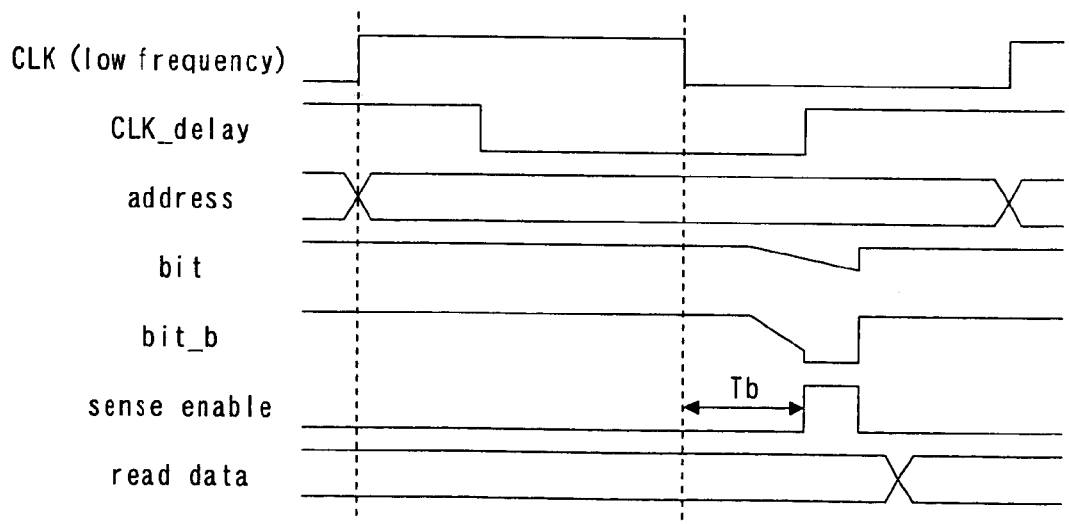
FIG. 2 is a table showing a setting example of a delay amount in a delay circuit according to the present invention.
FIG. 3 is a timing chart of a read operation performed by the RAM according to the present invention with a low frequency CLK signal.

The input of the delay circuit 5 includes a signal for inverting the CLK signal in the conventional CT signal. FIG. 2 is a table showing a setting example of a delay amount in a delay circuit according to the present invention. In this example, a 4-bit CT signal obtained by adding CT[3] to the 3-bit CT signal consisting of CT[0], CT[1] and CT[2] of FIG. 7 is input to the delay circuit 5. An EOR operation is applied between the CLK signal and CT[3] to invert the CLK signal at the time when the CT[3] is high. Further, as in the case of the conventional delay circuit 15, the delay circuit 5 switches the number of internal delay elements in accordance with the numerical value represented by CT[0], CT[1] and CT[2] to provide a delay amount to the signal, which is then output to the sense enable signal generation section 6 as CLK_delay. Therefore, it is possible to select the rise edge or fall edge of the CLK signal as a delay reference as well as to control the delay amount of the sense enable signal with respect to the selected edge within a range of −20 ps to +120 ps.

Figure 6A:
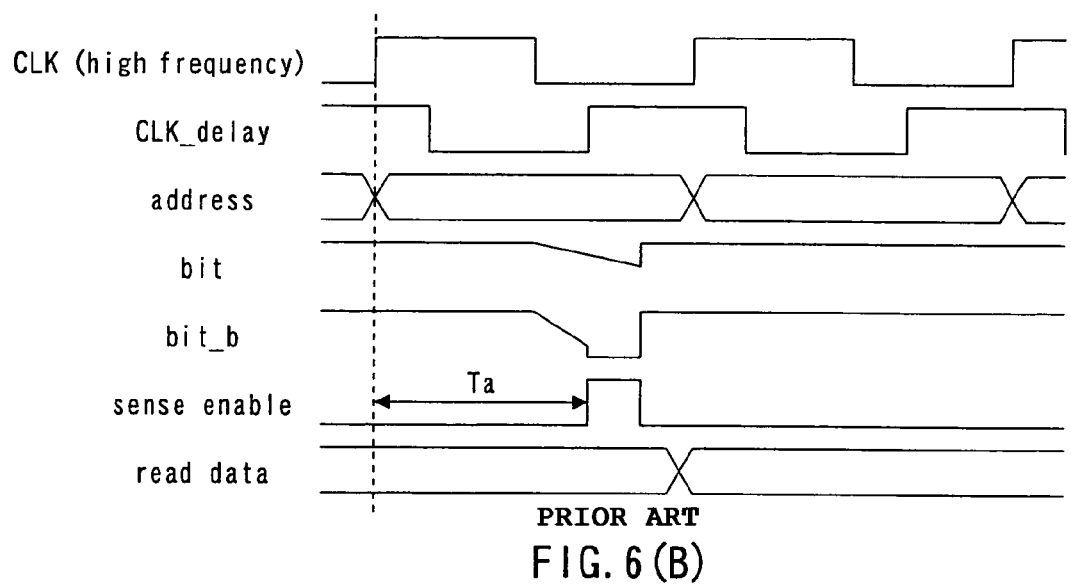
FIGS. 6A and 6B are timing charts of a read operation in the conventional RAM.
Figure 6B:
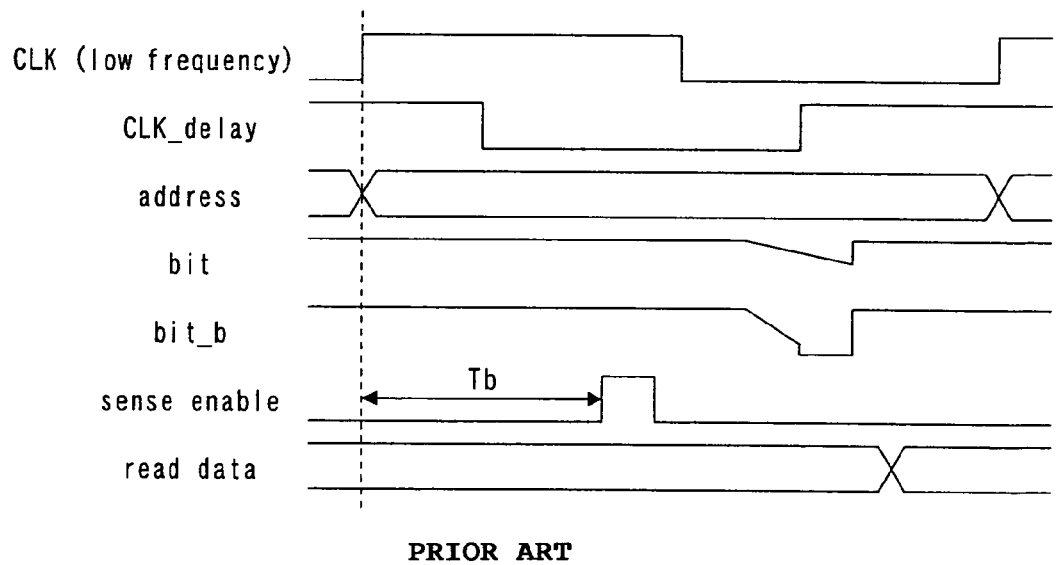

FIG. 3 is a timing chart of a read operation performed by the RAM according to the present invention with a low frequency CLK signal. Unlike the case shown in FIG. 6B, even when the time required from the rise edge of the CLK signal to the timing of bit signal and bit_b signal is large, the timing of the sense enable signal coincides with that of bit signal and bit_b signal since the delay amount Tb with respect to the fall edge of the CLK signal can be set. More specifically, in the case of FIG. 3, the fall edge of the CLK signal is selected with CT[3], and an adequate delay amount with respect to the fall edge is selected with CT[0], CT[1], and CT[2], with the result that the timing of the sense enable signal and that of bit signal and bit_b signal coincide with each other.

Figures 4, 5:
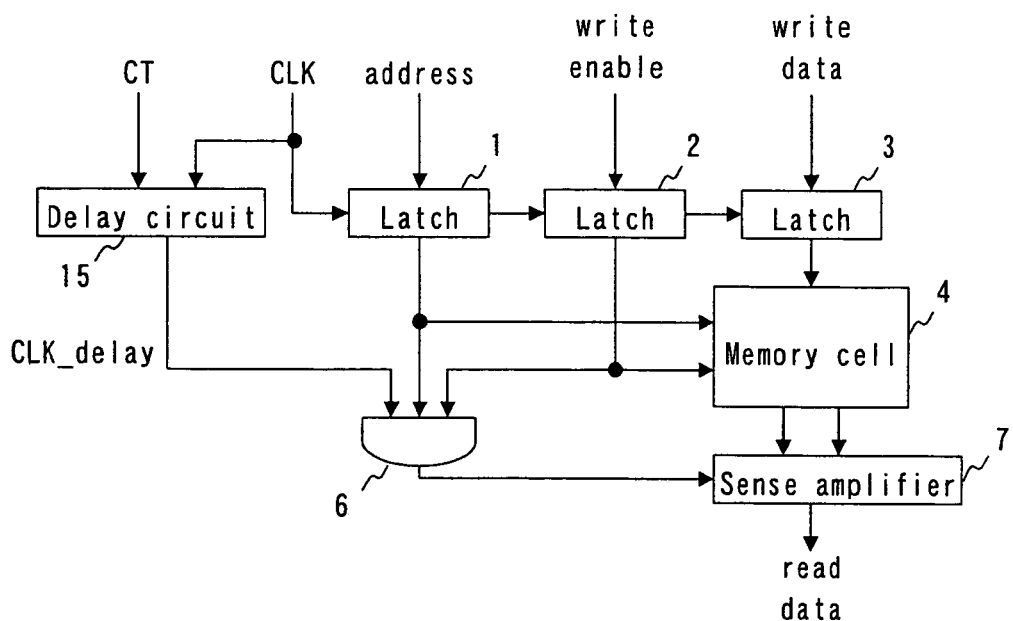
FIG. 4 is a table showing another setting example of a delay amount in a delay circuit according to the present invention.
FIG. 5 is a block diagram showing a configuration example of a conventional RAM.

In the above embodiment, 4-bit CT signal is used. Alternatively, however, it is possible to use a CT signal of another bit numbers. A 3-bit CT signal, which has been taken in the conventional example, is taken here as another example. FIG. 4 is a table showing another setting example of a delay amount in a delay circuit according to the present invention. In this example, a 3-bit CT signal consisting of CT[0], CT[1], and CT[2] is input to the delay circuit 5. In the delay circuit 5, an EOR operation is applied between the result of an AND operation among CT[0], CT[1] and CT[2] and the CLK signal to invert the CLK signal at the time when the CT value is CT7. Further, as in the case of the conventional delay circuit 15, the delay circuit 5 switches the number of internal delay elements in accordance with the numerical value represented by CT[0], CT[1] and CT[2] to provide a delay amount to the signal, which is then output to the sense enable signal generation section 6 as CLK_delay. Here, the delay amount is assumed to be 0 ps when the CT value is CT7.

Therefore, it is possible not only to control the delay amount of the sense enable signal with respect to the rise edge of the CLK signal within a range of −20 ps to +100 ps, but to elicit a ½ cycle delay in the operation with low frequency.

While a differential type sense amplifier is used in the above embodiment, it is possible to apply the present invention to a single end type sense amplifier.

What is claimed is:

1. A memory device that amplifiers read data based on the timing of a first clock signal input from an external device, comprising:
   a delay circuit that controls a code of the first clock signal and a delay amount based on a clock tune signal input from an external device to output a second clock signal;
   a sense enable signal generation section that generates a sense enable signal based on the second clock signal;

a memory cell that outputs data in accordance with an instruction from outside; and a sense amplifier that amplifiers the output from the memory cell in accordance with the sense enable signal.

2. The memory device according to claim 1, wherein the clock tune signal includes a plurality of bits, and the delay circuit applies an exclusive OR operation to one bit signal of the clock tune signal and the first clock signal to control the code.

3. The memory device according to claim 2, wherein the delay circuit controls the delay amount based on the numerical value represented by the signal other than the one bit of the clock tune signal.

4. The memory device according to claim 1, wherein the clock tune signal includes a plurality of bits, and the delay circuit applies an exclusive OR operation to the result of an AND operation among all bits of the clock tune signal and the first clock signal to control the code.

5. The memory device according to claim 4, wherein the delay circuit controls the delay amount based on the numerical value represented by the clock tune signal.

6. A memory device read method of amplifying read data based on the timing of a first clock signal input from an external device, comprising:

a delay step of controlling a code of the first clock signal and a delay amount based on a clock tune signal input from an external device to output a second clock signal;

a sense enable signal generation step of generating a sense enable signal based on the second clock signal;

a readout memory step of outputting data in accordance with an instruction from outside; and an amplification step of amplifying the output from the memory step in accordance with the sense enable signal.

7. The memory device read method according to claim 6, wherein the clock tune signal includes a plurality of bits, and the delay step applies an exclusive OR operation to one bit signal of the clock tune signal and the first clock signal to control the code.

8. The memory device read method according to claim 7, wherein the delay step further controls the delay amount based on the numerical value represented by the signal other than the one bit of the clock tune signal.

9. The memory device read method according to claim 6, wherein the clock tune signal includes a plurality of bits, and the delay step applies an exclusive OR operation to the result of an AND operation among all bits of the clock tune signal and the first clock signal to control the code.

10. The memory device read method according to claim 9, wherein the delay step controls the delay amount based on the numerical value represented by the clock tune signal.

11. A method of electronically amplifying read data, comprising:

controlling a code of a first clock signal to output a second clock signal; and amplifying data output in accordance with a sense enable signal generated based on the second clock signal.

* * * * *